(12) United States Patent
Chuang

(10) Patent No.: US 7,295,140 B2
(45) Date of Patent: Nov. 13, 2007

(54) OVERSAMPLING ANALOG-TO-DIGITAL CONVERTER AND METHOD WITH REDUCED CHOPPING RESIDUE NOISE

(75) Inventor: Shang-Yuan Chuang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/435,597

(22) Filed: May 17, 2006

(65) Prior Publication Data
US 2007/0013566 A1 Jan. 18, 2007

Related U.S. Application Data

(60) Provisional application No. 60/698,714, filed on Jul. 13, 2005.

(51) Int. Cl.
*H03M 3/00* (2006.01)

(52) U.S. Cl. .................................................. 341/143

(58) Field of Classification Search ................ 341/143, 341/155, 172; 708/250–256
See application file for complete search history.

(56) References Cited

U.S. PATENT DOCUMENTS

| | | | |
|---|---|---|---|
| 5,034,906 A | * | 7/1991 | Chang et al. ............... 708/250 |
| 5,383,143 A | * | 1/1995 | Crouch et al. .............. 708/254 |
| 6,201,835 B1 | * | 3/2001 | Wang ......................... 375/247 |
| 6,411,242 B1 | | 6/2002 | Oprescu et al. ............. 341/155 |
| 2005/0105591 A1 | * | 5/2005 | Egan ........................... 375/130 |

* cited by examiner

*Primary Examiner*—Brian Young
(74) *Attorney, Agent, or Firm*—Wade J. Brady, III; Frederick J. Telecky, Jr.

(57) ABSTRACT

A delta-sigma modulator includes a chopper-stabilized integrator, a quantizer having an input coupled to an output of the integrator, an input signal acquiring circuit controlled by a switched reference feedback circuit and having an output coupled to the input of the integrator, and a frequency-shaped pseudo-random chopper clock signal generator circuit including a pseudo-random sequence generator and producing a frequency-shaped pseudo-random clock signal. Resetting circuitry is coupled to reset inputs of the pseudo-random sequence generator to reset it in synchronization with the digital output of the chopper-stabilized delta-sigma modulator to prevent noise caused by wrap-around operation of the pseudorandom sequence generator. A logic circuit produces chopper clock signals in response to the frequency-shaped pseudo-random clock signal and applies them to various input switches and output switches of the integrator.

20 Claims, 6 Drawing Sheets

OVERSAMPLING ANALOG-TO-DIGITAL CONVERTER AND METHOD WITH REDUCED CHOPPING RESIDUE NOISE

CROSS REFERENCE TO RELATED APPLICATION

This application claims the benefit of prior commonly owned co-pending U.S. provisional application Ser. No. 60/698,714, filed Jul. 13, 2005, entitled "Oversampling analog-to-digital converter with improved noise and DC offset performance" by Shang-Yuan Chuang, and incorporated herein by reference.

BACKGROUND OF THE INVENTION

The invention relates generally to techniques for improving the conversion accuracy of chopper-stabilized delta-sigma modulators, particularly chopper-stabilized delta-sigma modulators of the type shown in commonly owned U.S. Pat. No. 6,201,835, and more particularly to reducing chopping residue noise and associated gain drift and offset drift inaccuracies.

The closest prior art is believed to include the above-mentioned U.S. Pat. No. 6,201,835 which is entitled "Frequency-shaped pseudo-random chopper stabilization circuit and method for delta-sigma Modulator" issued to Binan Wang on Mar. 13, 2001, and incorporated herein by reference.

Figures 1A, 1B:
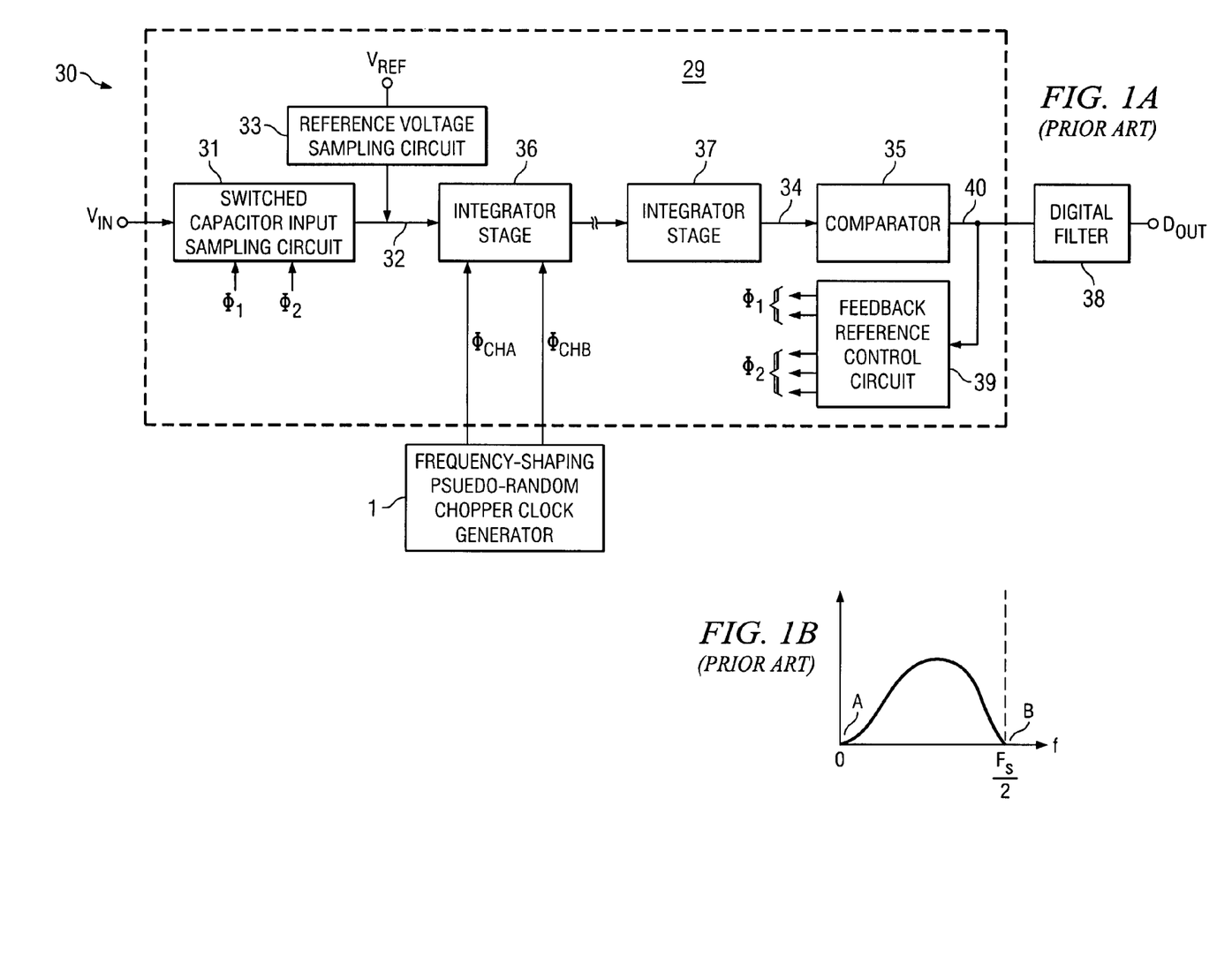
FIG. 1A is a copy of FIG. 1 of prior art U.S. Pat. No. 6,201,835.
FIG. 1B is a copy of FIG. 3C of prior art U.S. Pat. No. 6,201,835.

Prior Art FIG. 1A herein is a replication of FIG. 1 of above-mentioned U.S. Pat. No. 6,201,835 (the '835 patent), which shows a system for reducing sensitivity of an integrated circuit chopper-stabilized amplifier to intermodulation. Block 29 in Prior Art FIG. 1A shows a chopper-stabilized delta-sigma modulator which is identical to or substantially the same as in subsequently described FIG. 2. The output of chopper-stabilized delta-sigma modulator 29 is connected to the input of a decimation filter 38. One or more integrators, such as integrators 36 and 37, of chopper-stabilized delta-sigma modulator 29 are clocked by a frequency-shaping pseudo-random chopper clock generator circuit 1.

However, the prior art chopper-stabilized delta-sigma modulator 29 has the shortcoming that the disclosed pseudorandom chopper clock generator 1 produces a low frequency "chopping residue" signal. The fixed frequency chopping signal applied to chopper-stabilized delta sigma modulator 29 results in converting an internal offset voltage (which is due to mismatching of circuit components) into the low fixed frequency "chopping residue" signal, which is a low frequency AC signal. The magnitude of the chopping residue signal is a function of the magnitude of the above-mentioned offset voltage. The '835 patent teaches that intermodulation causes "idle tone" signals to be generated in the delta sigma modulator output signal when fixed frequency chopping signals are used. The '835 patent teaches that such idle tones, which are aliased back to the base band, can be avoided by providing the chopping signal at random frequencies. The '835 patent also discloses "frequency shaping" of the pseudorandom chopping signal. The low-frequency shaping results in the advantage of reducing the spread of low-frequency energy in the band of interest so as to improve overall noise performance.

The frequency-shaped pseudorandom chopping disclosed in the '835 patent provides a "first order" improvement in the amount of noise in the delta sigma modulator 29. However, the "first order" frequency-shaping is not sufficient to adequately suppress the chopping residue signal for applications in which very low noise is needed.

Referring to subsequently described FIG. 6, the upper curve labeled "A" shows the chopping residue noise for the prior art delta-sigma modulator 29 shown in FIG. 1A with the frequency-shaped curve shown in FIG. 1B (which is a replication of FIG. 3C of the '835 patent). Chopping residue noise curve "A" in FIG. 6 has a "noisy" shape, with a low-frequency noise level that is a function of the offset voltage, and has a level of roughly −150 dB, which is too high for some applications.

Another disadvantage of using the frequency-shaped pseudorandom sequence generator of the '835 patent to generate chopping clock signals for chopper stabilization of amplifier circuitry and delta-sigma modulators is that because of the finite length of the pseudorandom sequence it "wraps around" and starts over, causing noise spikes each time the sequence starts over. For example, if the pseudorandom sequence generator is 10 bits in length, it will produce the same sequence and wrap around every 210 clock cycles, thereby producing a low frequency periodic noise spike.

The closest prior art also is believed to include U.S. Pat. No. 6,411,242 entitled "Oversampling Analog-to-Digital Converter with Improved DC Offset Performance" issued to Oprescu et al. Jun. 25, 2002. This reference utilizes a fixed chopping frequency equal to one half of the data output frequency to allow switching the polarity of the analog input signal and output signal every chopping cycle. The offset error is removed from the output signal in the digital domain, but that approach reduces the digital data output rate by a factor of two because the analog-to-digital converter must perform two conversions before it can effectively average the output data so as to cancel the offset error.

Thus, there is an unmet need for an improved technique for reducing the noise of a chopper-stabilized oversampling analog-to-digital converter using frequency-shaped pseudorandom chopping clock signals.

There also is an unmet need for an improved technique for reducing conversion errors in a chopper-stabilized delta-sigma analog-to-digital converter using frequency-shaped pseudorandom chopping clock signals.

There also is an unmet need for a chopper-stabilized amplifier circuit in a chopper-stabilized delta-sigma modulator which has the benefits of the very low idle tone magnitudes achieved by the circuitry of commonly owned U.S. Pat. No. 6,201,835 and which also has the benefits of very low chopping residue noise.

There also is an unmet need for an improved technique for reducing conversion errors in a chopper-stabilized delta-sigma analog-to-digital converter using frequency-shaped pseudorandom chopping clock signals and also for reducing low frequency periodic noise spikes resulting from wrap-around operation of a pseudorandom sequence generator used to produce the chopping clock signals.

There also is an unmet need for an improved technique for reducing conversion errors in a chopper-stabilized delta-sigma analog-to-digital converter using frequency-shaped pseudorandom chopping clock signals and also for improving the speed of conversion over the prior art.

SUMMARY OF THE INVENTION

It is an object of the invention to provide an improved technique for reducing the noise of a chopper-stabilized oversampling analog-to-digital converter using frequency-shaped pseudorandom chopping clock signals.

It is another object of the invention to provide an improved technique for reducing conversion errors in a chopper-stabilized delta-sigma analog-to-digital converter using frequency-shaped pseudorandom chopping clock signals.

It is another object of the invention to provide a chopper-stabilized amplifier circuit in a chopper-stabilized delta-sigma modulator which has the benefits of very low magnitude idle tones achieved by the invention of the '835 patent and which also has the benefits of very low chopping residue noise.

It is another object of the invention to provide an improved technique for reducing conversion errors in a chopper-stabilized delta-sigma analog-to-digital converter using frequency-shaped pseudorandom chopping clock signals and also for reducing low frequency periodic noise spikes resulting from wrap-around operation of a pseudo-random sequence generator used to produce the chopping clock signals.

It is another object of the invention to provide an improved technique for reducing conversion errors in a chopper-stabilized delta-sigma analog-to-digital converter using frequency-shaped pseudorandom chopping clock signals and also for improving the speed of conversion over the prior art.

Briefly described, and in accordance with one embodiment, the present invention provides a delta-sigma modulator (29) which includes a chopper-stabilized integrator (36), a quantizer (35) having an input coupled to an output of the integrator, an input signal acquiring circuit (31) controlled by a switched reference feedback circuit (39) and having an output coupled to the input of the integrator, and a frequency-shaped pseudo-random chopper clock signal generator circuit (1A) including a pseudo-random sequence generator (11) and producing a frequency-shaped pseudo-random clock signal ($\phi_{CH}$). Resetting circuitry (48) is coupled to set inputs of the pseudorandom sequence generator to reset it in synchronization with the digital output of the chopper-stabilized delta-sigma modulator to prevent noise caused by wrap-around operation of the pseudorandom sequence generator. A logic circuit produces chopper clock signals in response to the frequency-shaped pseudo-random clock signal and applies them to various input switches and output switches of the integrator.

In a described embodiment, a delta-sigma modulator (29) includes a chopper-stabilized integrator (36) including a plurality of chopper stabilization input switches coupled to an input of the integrator and a plurality of chopper stabilization output switches coupled to an output of the integrator, and a quantizer (35) having an input coupled to the output of the integrator. An input signal acquiring circuit (31) is controlled by a switched reference feedback circuit (39) and has an output coupled to the input of the integrator. A frequency-shaped pseudo-random chopper clock signal generator circuit (1A) includes a pseudo-random sequence generator (11) and produces a frequency-shaped pseudo-random clock signal ($\phi_{CH}$). Resetting circuitry (48) for resetting the pseudo-random sequence generator (11) in synchronization with a digital output ($D_{OUT}$) of the chopper-stabilized delta-sigma modulator (29) operates to prevent wrap-around operation of the pseudorandom sequence generator (11). A logic circuit (41) produces, in response to the frequency-shaped pseudo-random clock signal, chopper clock signals applied to control various ones of the chopper stabilization input switches and chopper stabilization output switches.

In a described embodiment, the frequency-shaped pseudo-random sequence generator (1A) includes a digital delta-sigma modulator (2), the digital delta-sigma modulator (2) including a feedback delay circuit (14,15), a first digital adder (12) receiving as inputs a pseudo-random sequence signal (11A) produced by the pseudo-random sequence generator (11) and an error feedback signal (18) produced by the feedback delay circuit (14,15) and functioning as a 1-bit quantizer (13) to produce the frequency-shaped pseudo-random clock signal ($\phi_{CH}$) in response to the pseudo-random sequence signal (11A) and the error feedback signal (18). A second digital adder (16) produces a digital error signal (16A) as an input to the feedback delay circuit (14,15) in response to the frequency-shaped pseudo-random clock signal ($\phi_{CH}$) and the error feedback signal (16A). A decimation filter (38) has an input coupled to an output (40) of the quantizer (35), wherein the resetting circuitry (48) includes a divider circuit (48) which divides a clock signal (CLK) operating at a sampling frequency ($F_S$) of the delta-sigma modulator (29) by a decimation ratio (N) to produce a decimation clock signal (DCLK). The pseudorandom sequence generator (11) is clocked by the clock signal (CLK) and includes a sequence of memory elements (50-0,1 . . . 7) having set inputs coupled to the decimation clock signal (DCLK). The decimation filter (38) is clocked by the clock signal (CLK) and operates in response to the decimation clock signal (DCLK) to produce digital output words at the frequency ($F_S$) of the decimation clock signal (DCLK).

In a described, the frequency-shaped pseudo-random clock signal ($\phi_{CH}$) constitutes a 1-bit quantization signal applied to a MSB of the second input of the second digital adder (16). The feedback delay circuit (14,15) delays the error signal (16A) twice by a predetermined amount to achieve increased attenuation near zero frequency and near a frequency ($F_S/2$). The digital delta-sigma modulator (2) can be a 1-bit digital delta-sigma modulator. The decimation filter (38) can be a SYNC4 filter. The input signal acquiring circuit (31) can include a switched capacitor input sampling circuit.

In one embodiment, the invention provides a method of reducing sensitivity of a chopper-stabilized modulator (29) including an input signal acquiring circuit (31) having an output coupled to an input of a chopper-stabilized integrator (36), and a quantizer (35) having an input coupled to an output of the integrator, wherein the method includes producing a frequency-shaped pseudo-random clock signal ($\phi_{CH}$) by means of a frequency-shaped pseudo-random chopper clock signal generator circuit (1A) including a pseudo-random sequence generator (11), and automatically resetting the pseudo-random sequence generator (11) in synchronization with a digital output ($D_{OUT}$) of the chopper-stabilized delta-sigma modulator (29) to prevent wrap-around operation of the pseudorandom sequence generator (11) and thereby prevent noise due to such wraparound operation.

In one embodiment, the invention provides a delta-sigma modulator (29) including an input signal acquiring circuit (31) having an output coupled to the input of a chopper-stabilized integrator (36), and a quantizer (35) having an input coupled to an output of the integrator, means (1A) for producing a frequency-shaped pseudo-random clock signal ($\phi_{CH}$), and means (48) for resetting the pseudo-random sequence generator (11) in synchronization with a digital output ($D_{OUT}$) of the chopper-stabilized delta-sigma modulator (29) to prevent wrap-around operation of the pseudo-random sequence generator (11) and thereby prevent noise due to such wraparound operation.

DETAILED DESCRIPTION OF THE PREFERRED EMBODIMENTS

Figure 1C:
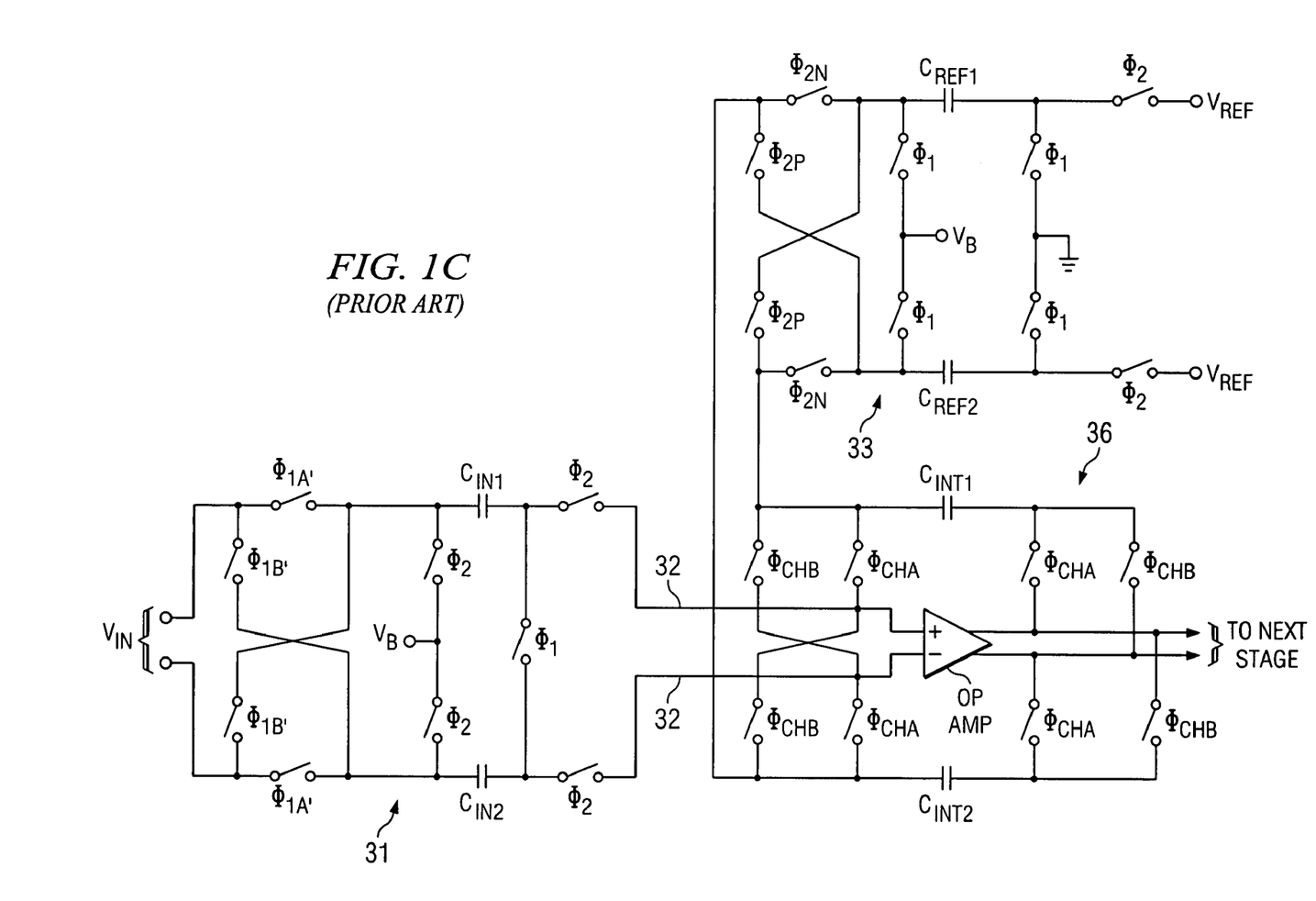
FIG. 1C is a copy of FIG. 4 of prior art U.S. Pat. No. 6,201,835.
Figure 2:
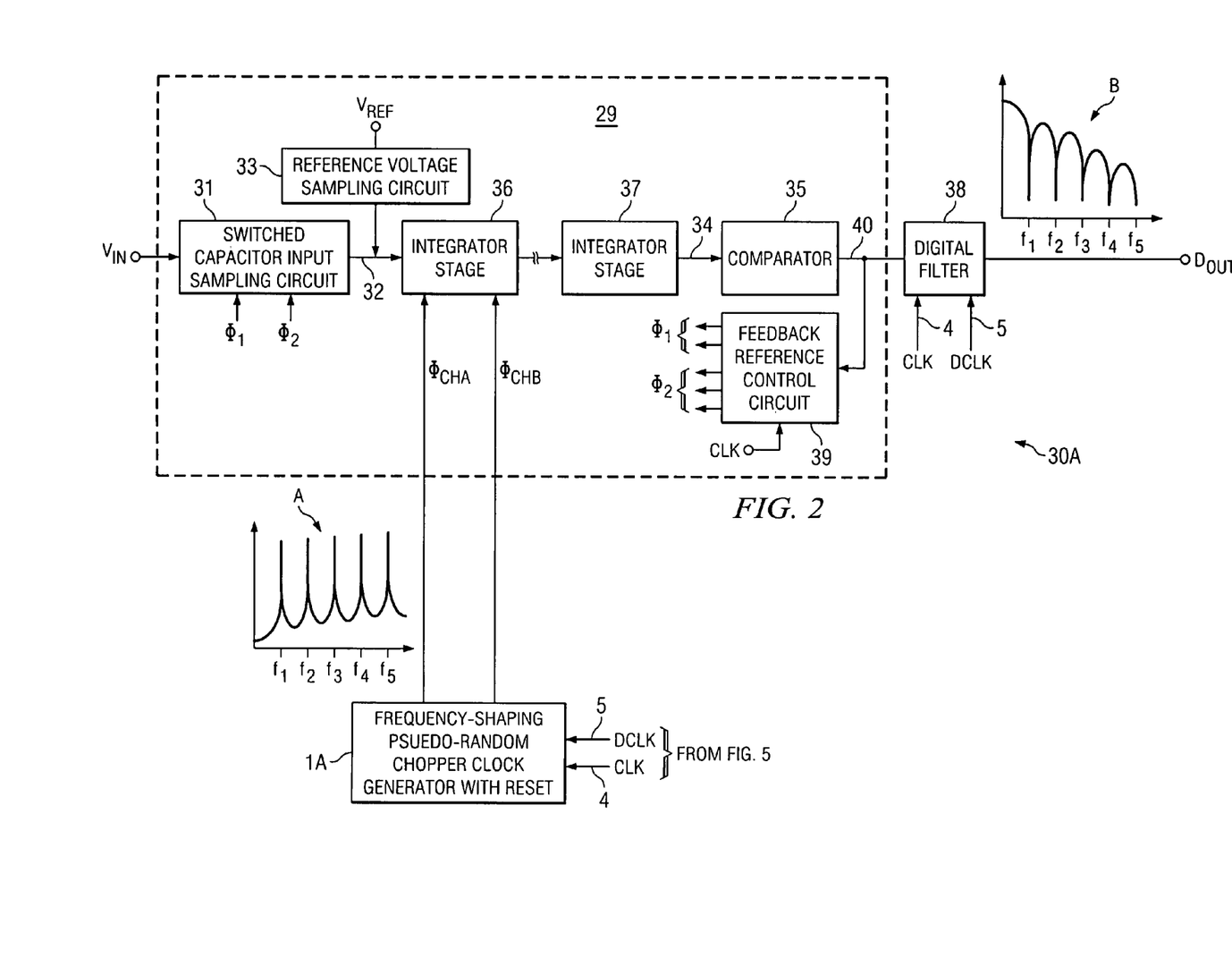
FIG. 2 is a block diagram of a chopper-stabilized delta-sigma modulator with an automatically resetting pseudorandom chopping signal circuit in accordance with the present invention.

Referring to FIG. 2, analog-to-digital converter (ADC) 30A includes chopper-stabilized delta-sigma modulator 29, which includes a switched capacitor input sampling circuit 31 that samples a differential analog input VIN. Two fixed-frequency clock signals $\phi_1$ and $\phi_2$ accomplish the analog input sampling in a known fashion, as disclosed in commonly owned U.S. Pat. No. 5,703,589 issued Dec. 30, 1997 to Kalthoff et al. The sampled differential analog input signal appears between a pair of summing node conductors 32 which are coupled, respectively, to the differential inputs of a chopper-stabilized first integrator stage 36. Chopper-stabilized integrator stage 36 and associated switched capacitor feedback reference voltage supply circuits may be implemented as shown in Prior Art FIG. 1C. Summing node conductors 32 also are coupled to corresponding terminals of a switched capacitor feedback reference voltage sampling circuit 33 that is similar to the circuitry 22A shown in FIG. 3A of the above referenced '589 patent. Although a differential implementation is shown in FIG. 2, the invention described herein is equally applicable to a single ended implementation.

Chopper-stabilized delta-sigma ADC 30A may include a number of additional integrator stages such as stage 37 and associated switched capacitor feedback reference voltage supply circuits, which may or may not be chopper-stabilized. The differential output 34 of the final integrator stage 37 (or integrator stage 36 if it is the only integrator stage) are coupled to the inputs of a conventional differential comparator 35. The differential outputs 40 of comparator 35 are coupled to the inputs of both a conventional decimation filter 38 and a conventional feedback reference control circuit 39. Decimation filter 38 can be implemented as a SYNC4 filter. Feedback reference control circuit 39 produces the fixed-frequency clock signals $\phi1$ and $\phi2$, and also produces the additional clock signals $\phi1A$, $\phi1B$, $\phi2N$, and $\phi2P$ needed by input sampling circuit 31, integrators 36 and 37, and reference voltage sampling circuit 33 (e.g., see FIG. 1C) as determined by the output of comparator or quantizer 35, in a well known fashion. Decimation filter 38 produces the digital output signal $D_{OUT}$ into which the analog input signal $V_{IN}$ is converted at a data rate determined by decimation clock signal DCLK.

Figure 3A:
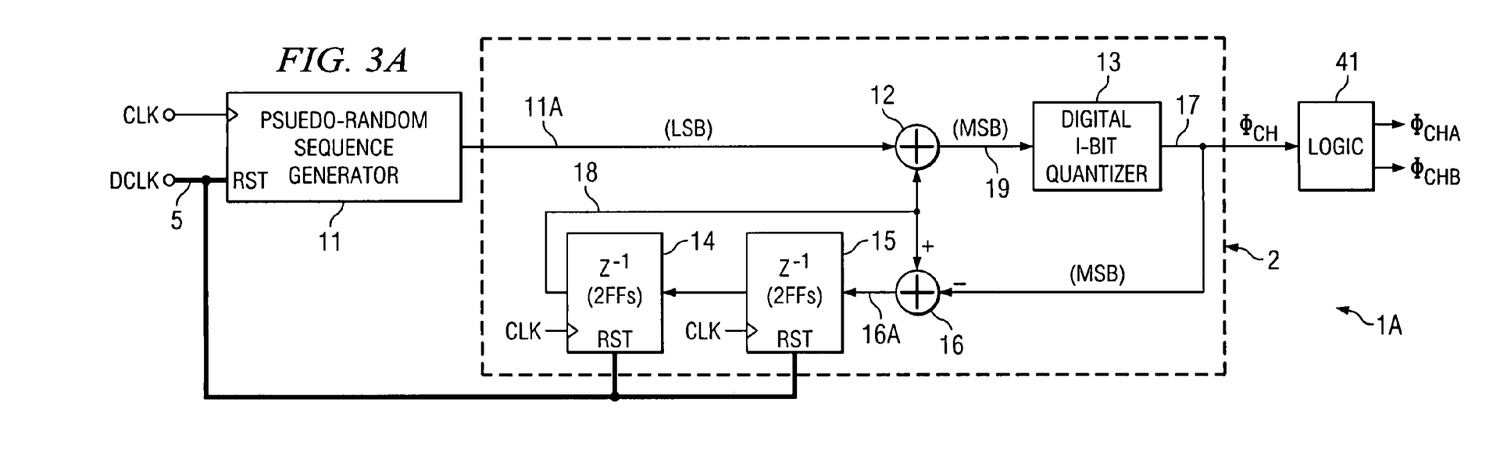
FIG. 3A is a block diagram of one embodiment of the automatically resetting frequency-shaping pseudo-random chopper clock generator in block 1A of FIG. 2.
Figure 4:
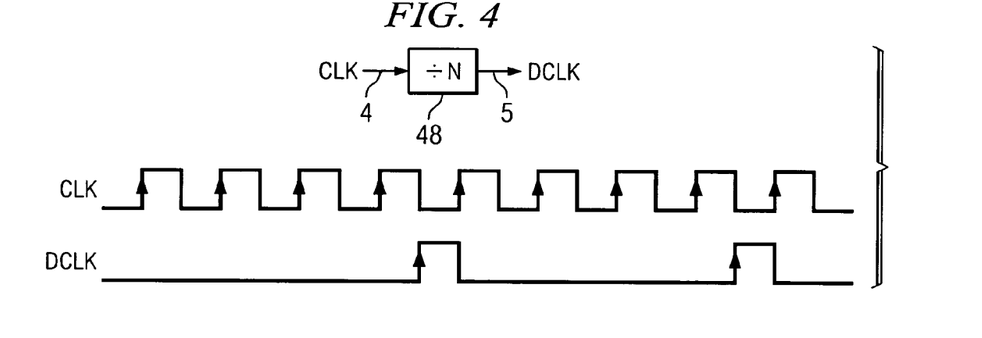
FIG. 4 illustrates generation of the decimation clock signal DCLK in FIG. 2 from the sampling clock signal CLK.

Decimation clock DCLK on conductor 5 has a frequency equal to the frequency $F_S$ of the sampling clock signal CLK on conductor 4 divided by the decimation ratio N. FIG. 4 illustrates how decimation clock DCLK is generated from the main clock signal CLK by means of a conventional divide-by-N circuit 48. The period of CLK is equal to the inverse of the sampling frequency $F_S$, and the period of decimation clock DCLK is equal to $N/F_S$. For simplification in FIG. 4, the decimation ratio N is shown equal to 4, but it should be appreciated that N=4 would be an unrealistically low decimation ratio. A more practical decimation ratio N might be 960, or perhaps 7680, so as to provide a suitably long pseudorandom sequence. Subsequently described FIG. 3A shows how the frequency-shaped pseudorandom sequence generator 1A in FIG. 2 can be implemented to include the function of being reset in synchronization with decimation clock DCLK to avoid the noise generated by the inherent "wrap around" operation of a free-running pseudo-random sequence generator.

Figure 5:
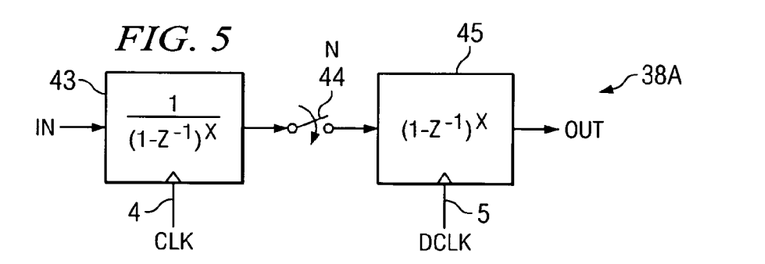
FIG. 5 is a block diagram of a Z domain realization of a sync$^x$ filter which can be used in block 38 of FIG. 2.

FIG. 5 illustrates a generalized Z domain realization of a SYNC$^x$ filter having a transfer function $\{(1-Z^{-N})^x\}/\{(1-Z^{-1})^x\}$, where N is equal to the decimation ratio. The switch 44 is synchronized to the decimation clock DCLK and is a typical way of representing the down-sampling. SYNC4 filter 38 in FIG. 2 is realized in this manner for x=4, and includes four integrators and four decimators. However, it should be noted that the SYNC4 filter 38 may be a SYNC filter of a different order. Furthermore, other kinds of filters may provide adequate rejection of the resetting frequency spikes indicated by graph "A" in FIG. 2.

In accordance with the present invention, chopper-stabilized delta-sigma ADC 30A includes a frequency-shaped pseudo-random chopper clock generator circuit 1A that is automatically reset in synchronization with the data output ($D_{OUT}$) time frame and generates chopper clock signals $\phi_{CHA}$ and $\phi_{CHB}$ applied to at least the first integrator stage 36 (but also can be applied to a subsequent integrator stage such as stage 37). Each chopper clock signal has a frequency spectrum that can be "shaped" as shown in FIG. 1A, rather than being of a single fixed frequency as in all known prior chopper stabilized delta-sigma analog-to-digital converters.

Figure 6:
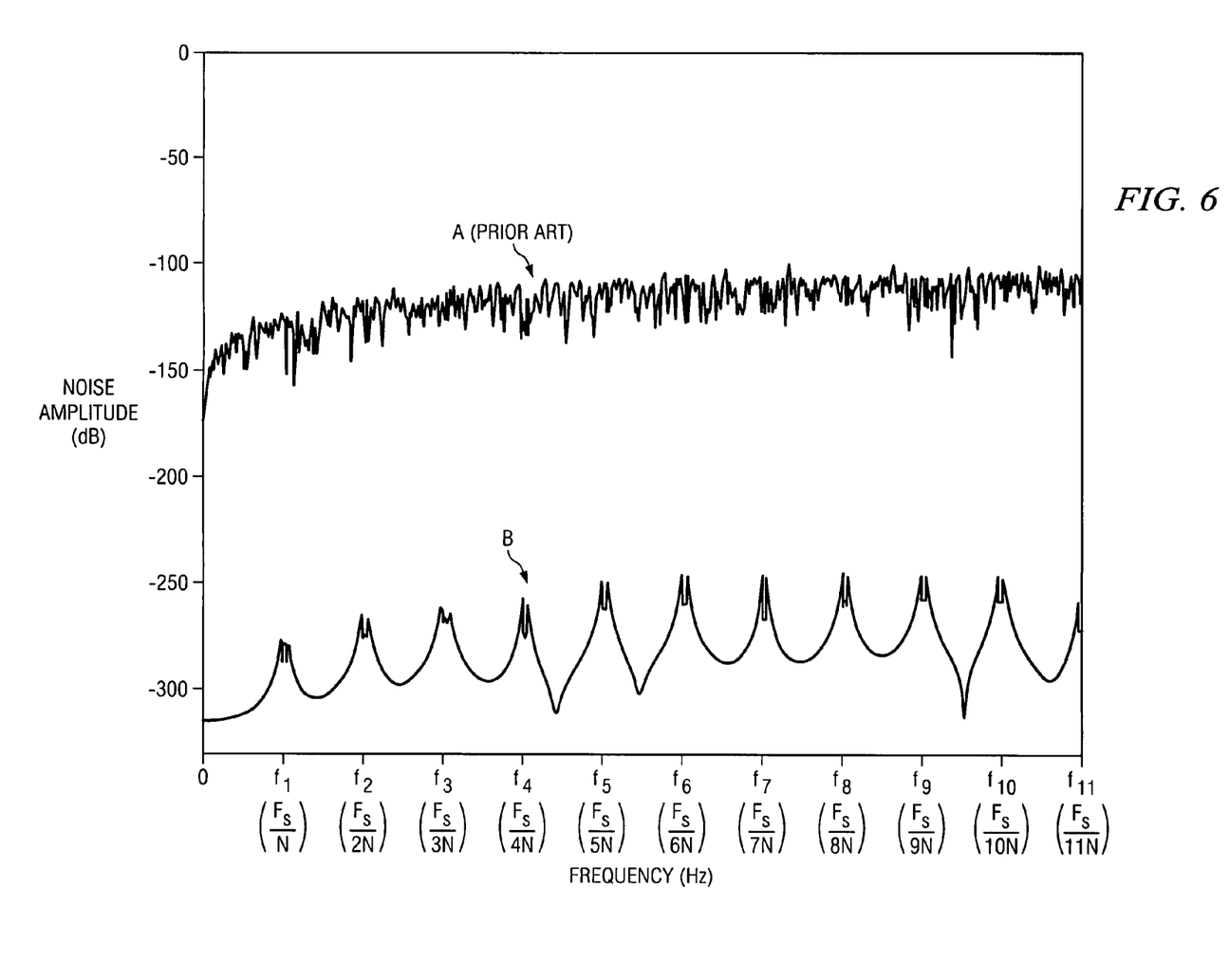
FIG. 6 is a graph illustrating the high chopping residue noise of the prior art shown in FIG. 1A compared to the much lower chopping residue noise of the present invention as shown in FIG. 2.

In FIGS. 2 and 6, the vertical axes of the various graphs indicate output voltage amplitude represented by the value of $D_{OUT}$ with $V_{IN}$ equal to zero, and thereby represents the noise. Graph A in FIG. 2 shows the frequency response of the frequency-shaping pseudo-random chopper clock generator, with spikes at f1 (0-f1 being the band of interest) and the harmonic spikes at f2, f3 . . . etc., which in accordance with the present invention is periodically reset in synchronization with the decimation clock DCLK to allow filtering of the resulting tone at the $D_{OUT}$ data rate, which later is rejected by digital filter 38. Graph B in FIG. 2 shows the frequency response of SYNC4 filter 38. Graph B in FIG. 6 shows a convolution of (e.g., multiplication of) the frequency responses represented by graphs A and B in FIG. 2. Graph B in FIG. 6 indicates that the result of the convolution is a very low noise level, close to −300 dB, in chopper-stabilized ADC 30A of FIG. 2. The −300 dB level of noise of oversampling chopper-stabilized analog-to-digital converter 30A in FIG. 2 is much lower than the −150 dB (decibel) level for the prior art shown in FIG. 1A can be considered to be negligible. Also, there are no appreciable tone frequencies (due to intermodulation) being aliased back into the base band.

The lower noise curve "B" in FIG. 6, i.e., the convolution of the frequency response of SYNC4 filter 38 and the frequency response of the frequency-shaping pseudorandom chopper clock generator circuit 1A, with its automatic resetting structure and operation as shown in FIGS. 2 and 3A, shows that all of the spikes at f1, f2, f3 . . . etc. that are provided in accordance with the present invention in frequency response "A" in FIG. 2 are effectively filtered out.

Referring to FIG. 3A, frequency-shaping pseudo-random chopper signal generator circuit 1A includes pseudo-random sequence generator 11. Pseudo random sequence generator 11 can be of a conventional design. See the text "Shift Register Sequences", by S. Goloumb, Aegan Park Press, Laguna Hills, Calif., 1982, or the one shown in block 12 of the above-referenced '202 patent.

Figure 3B:
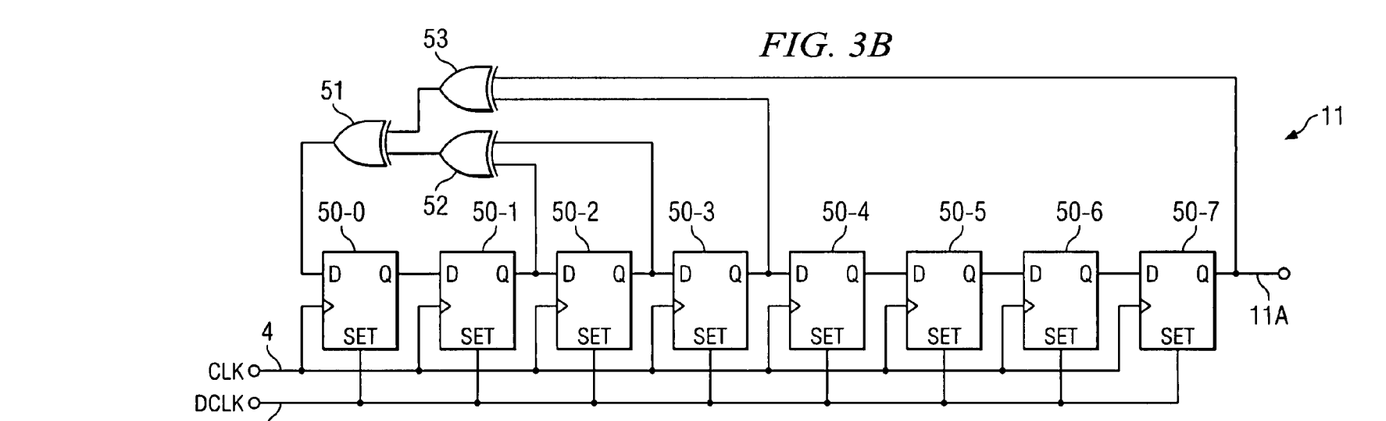
FIG. 3B is a block diagram of circuitry which is automatically reset in block 11 of FIG. 3A to prevent wrap-around operation.

FIG. 3B is a detailed block diagram of an implementation of pseudorandom sequence generator 11 of FIG. 3A. This particular implementation is described on page 180 of "HDL Chip Design" by Douglas J. Smith, Doone Publications, Madison, Ala., 1996. Referring to FIG. 3B, this implementation pseudorandom sequence generator 11 includes D-type flip-flops 50-0,1,2 . . . 7 each having its clock input coupled to CLK and a set input coupled to DCLK. The Q output of flip-flop 50-7 is connected by conductor 11A of FIG. 3B to one input of an exclusive OR gate 53, the output of which is connected to one input of an exclusive OR gate 51. The output of exclusive OR gate 51 is connected to the D input of flip-flop 50-0. The Q output of each of flip-flops 50-0, 1 . . . 6 is connected to the D input of the next flip-flop. The Q outputs are the "tap points" of pseudorandom sequence generator 11, and in FIG. 3B the Q output of flip-flop 50-3 is connected to the other input of exclusive OR gate 53. The Q output of flip-flop 50-2 is connected to one input of an exclusive OR gate 52, the output of which is connected to the other input of exclusive OR gate 51. The Q output of flip-flop 50-1 is connected to the other input of exclusive OR gate 52.

Pseudorandom sequence generator 11, connected to be automatically resettable in response to DCLK in accordance with the present invention to avoid wrap around operation, produces a serial 1-bit pseudo-random signal on conductor 11A, which is connected to a second input of digital adder 12. (It should be appreciated that various other connections of the tap points to the inputs of the various exclusive OR gates of pseudorandom generator 11 as shown in FIG. 3B can be provided to generate various pseudorandom sequences, as explained in the above mentioned Douglas J. Smith reference.)

Pseudorandom sequence generator 1A also includes a digital (rather than analog) "first order" delta-sigma modulator 2, which includes no input. (Since the input is zero, the digital adder normally present in a delta-sigma modulator for adding the input to the output of delay element 14 is unnecessary.) First order digital delta-sigma modulator 2 includes two 2-bit digital delay elements 14 and 15 connected in an error feedback circuit. Each of delay elements 14 and 15 of which can be implemented by a pair of conventional flip flops each having a clock input coupled to the main clock signal CLK, which runs at the sampling rate $F_S$ of delta-sigma modulator 29. Each of delay elements 14 and 15 also has a reset input coupled to decimation clock DCLK.

The error feedback circuit includes a digital 2-bit adder 16 having a 2-bit (+) input connected to 2-bit bus 18. Adder 16 also includes a (−) input, an MSB of which is connected to conductor 17, and a 2-bit output 16A connected to the input of the first digital delay element 15. The output of first digital delay element 15 is connected to the input of second digital delay element 14, the output of which is connected to 2-bit bus 18. The output of delay element 14 provides a delayed serial digital signal on 2-bit bus 18, which is applied to the 2 bits of a first input of a 2-bit digital adder 12. An LSB bit of the second input of digital adder 12 is connected to the 1-bit output of pseudo-random sequence generator 11

In effect, the 1-bit pseudo-random signal on conductor 11A functions as a pseudo-random dither input to digital delta-sigma modulator 2. Digital 2-bit adder 12 produces a 1-bit signal on conductor 19 which is the MSB of the output of 2-bit adder 12 and hence is equal to the sum of the 1-bit digital signal on conductor 11A and the 2-bit error feedback data on 2-bit bus 18. As such, the MSB adder output signal on conductor 19 actually functions as a digital 1-bit quantizer. That 1-bit quantizer function is illustrated by block 13 in FIG. 3A, although in the actual implementation of FIG. 3A conductor 19 is connected directly to conductor 17. The 1-bit quantizer signal on conductor 17 constitutes a frequency-shaped pseudo-random clock signal $\phi_{CH}$ on conductor 17.

Conductor 17 applies $\phi_{CH}$ to the (−) input of 2-bit digital adder 16 to provide the feedback necessary to accomplish the frequency shaping referred to. Conductor 17 also is connected to the input of a conventional logic circuit 41 that generates two chopper clock signals $\phi_{CH}$ and $\phi_{CHB}$, wherein $\phi_{CHA}$ is identical to $\phi_{CH}$, and $\phi_{CHB}$ is out-of-phase with and does not overlap $\phi_{CHA}$. The 2-bit feedback structure in the digital delta-sigma modulator 2 shown in FIG. 3A was used because it very efficiently produces the low-frequency shaping indicated by "A" and high-frequency shaping indicated by "B" in the frequency spectrum of $\phi_{CH}$ shown in FIG. 1B. However, a 1-bit feedback structure or an N-bit feedback structure wherein N is greater then 2 also could be used.

Referring to the chopper clock frequency spectrum shown in FIG. 1B, frequency-shaping pseudo-random chopper clock generator 1A attenuates the DC offset and low frequency noise in the lower frequency region indicated by "A" so that those low frequency noise components are reduced. In the high frequency region "B", the high frequency tone coupling is minimized at $_{FS}/2$, where the largest high-frequency tones are observed ($F_S$ being the sampling frequency of delta-sigma modulator 29).

Above-mentioned one-bit digital delta-sigma modulator 2 in FIG. 3A operates to provide a feedback delay in which the two 2-bit delay elements 15 and 14 delay the difference between the 1-bit output 17 of digital quantizer 13 and the 2-bit word on 2-bit digital bus 18. That delayed 2-bit word is added to the 1-bit pseudo-random sequence produced on conductor 11A by pseudo-random sequence generator 11. The MSB of the 2-bit word produced by adder 12 represents the algebraic sign of that 2-bit word. The "1" bits of the pseudo-random sequence on conductor 11A add an LSB value to the delayed 2-bit word on conductor 18 to represent one half of the quantizing level. The above described first order digital modulator structure with error feedback as shown in FIG. 3A provides two delays rather than one, in the loop feedback circuit. The provision of the two delays in the feedback results in the output of the delta-sigma modulator having attenuation not only at DC but also at $f_{FS/2}$. This results in digital delta-sigma modulator 2 having the desired frequency-shaped spectrum shown in FIG. 1B.

Figure 3C:
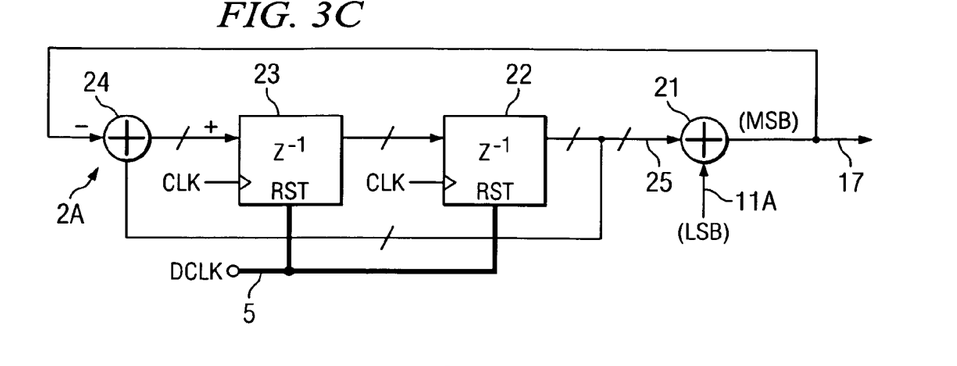
FIG. 3C is a block diagram showing another embodiment of a resetting frequency-shaping pseudo-random chopper clock generator which could be used in block 1A of FIG. 2.

Note that a modified digital delta-sigma modulator with an integrator-based architecture as shown in FIG. 3C could be used instead of the error feedback architecture shown in FIG. 3A. In FIG. 3C, first order digital delta-sigma modulator 2A includes a first delay element 23 and a second delay element 22. The input of delay element 23 is connected to the output of a 2-bit digital adder 24. The output of delay element 23 is connected to the input of delay element 22, the output of which is connected by 2-bit bus 25 to a first input of 2-bit digital adder 21. As in FIG. 3A, the output sequence 11A produced by pseudo-random sequence generator 11 is applied in FIG. 3C to the LSB of a second input of digital adder 21. The MSB output of digital adder 21 functions as a quantizer just as in FIG. 3A, producing φCH on conductor 17, which is fed back to the MSB of a first input of a 2-bit digital adder 24. The output of 2-bit adder 24 is connected to the input of delay element 23. The 2-bit digital signal on bus 25 is fed back to a second input of 2-bit adder 24. Digital delta-sigma modulator 2A could be a lower or higher order delta-sigma modulator by providing fewer or more integrators, respectively, in the architecture of FIG. 3C. The digital delta-sigma modulator structures of FIGS. 3A and 3B both provide a 1-bit output, and both use dither as an LSB input to smooth the output spectrum, have no input (i.e., implicitly, a zero input), and can be of any order suitable to achieve the desired spectrum of the spreading of chopper clock energy and a low level of chopper clock energy at and near DC.

The above circuitry thus frequency-shapes the spectrum of the pseudo-random chopper clock $\phi_{CH}$ produced on conductor 17 to provide the spectrum for the chopper clock energy shown in the graph of FIG. 1B, thus reducing the sensitivity to intermodulation at any DC input level for an analog modulator with chopper stabilization.

The pseudo-random spreading of the carrier signal over the entire spectrum prevents concentration of too much energy in a particular band. This, in combination with the "frequency-shaping" $\phi_{CH}$ accomplished by 2-bit digital delta-sigma modulator 2 of FIG. 3A, reduces the sensitivity of delta-sigma modulator 30A to the above mentioned intermodulation. The above described first order digital modulator structure with error feedback as shown in FIG. 3A provides two delays rather than one, in the loop feedback circuit. The provision of the two delays in the feedback results in the output of the delta-sigma modulator having attenuation not only at DC but also at $F_S/2$. This results in digital delta-sigma modulator 2 having the desired frequency-shaped spectrum shown in FIG. 1B, thus reducing the sensitivity to intermodulation at any DC input level for an analog modulator with chopper stabilization.

The above described chopper-stabilized analog-to-digital converter 30A of the present invention avoids the problems of the first order noise-shaped pseudorandom chopping scheme of U.S. Pat. No. 6,201,835 that randomizes the chopping energy so that no fixed frequency components near $F_S/2$ to "beat" back to the base band. As previously mentioned, the finite length of the pseudo-random number generator 1A as shown in Prior Art FIG. 1A causes "wrap around" operation that generates periodic noise spikes, especially for a high decimation ratio N. Also, a chopping residue signal which is a function of the offset voltage remains in the band of interest and causes high noise. Both kinds of noise referred to reduce conversion accuracy of the prior art chopper-stabilized analog-to-digital converter 30 shown in Prior Art FIG. 1.

Figure 7:
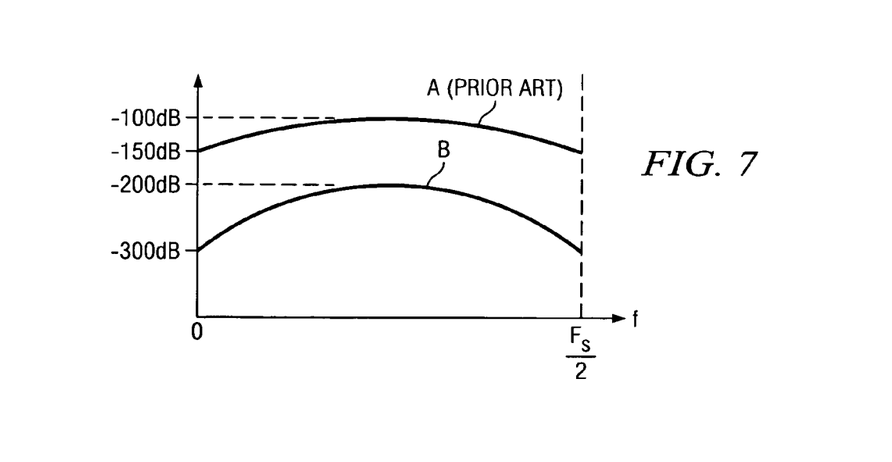
FIG. 7 is another graph illustrating the high chopping residue noise of the prior art shown in FIG. 1A compared to the much lower chopping residue noise of according to the present invention as shown in FIG. 2 on a greater time scale than is shown in FIG. 6.

However, both kinds of noise are avoided by use of the automatically resetting pseudorandom chopper clock circuit 1A in chopper-stabilized analog-to-digital converter 30A in FIG. 2, with its pseudorandom sequence generator being automatically repetitively reset at data output rate. SYNC4 decimation filter 38 with a 10 Hz data output rate is used with, for example, "zeros" at 10 Hz, 20 Hz, 30 Hz, 40 Hz, ..., so that SYNC4 decimation filter 38 functions so as suppress the energy spikes caused by resetting pseudorandom sequence generator 1A at 10 Hz, by providing the frequency response characteristic shown by curve "B" in FIG. 2. The convolution of the frequency responses "A" and "B" in FIG. 2 results in the very low level of roughly −300 dB shown in lower curve "B" in FIGS. 6 and 74 chopper-stabilized delta-sigma analog-to-digital converter 30A.

While the invention has been described with reference to several particular embodiments thereof, those skilled in the art will be able to make various modifications to the described embodiments without departing from the true spirit and scope of the invention. It is intended that all elements or steps which are insubstantially different or perform substantially the same function in substantially the same way to achieve the same result as what is claimed are within the scope of the invention.

For example, the chopper stabilization techniques described above in conjunction with a switched capacitor delta-sigma modulator also are applicable to a "continuous time" delta-sigma modulator. The term "continuous time" refers to a circuit such as a delta-sigma modulator that uses resistors or current sources in place of switched capacitor networks. Thus, the charge being integrated by an integrator in a "continuous time" delta-sigma modulator is integrated continuously, rather than in discrete quantities as in a switched capacitor delta-sigma modulator, hence the term "continuous time". Also, the frequency-shaped pseudo-random chopping described herein is applicable to chopper switches that are located within, rather than external to, an integrator and are coupled to the inputs or outputs of the integrator from within.

Also, the pseudorandom noise-shaped chopping described above in FIG. 3A illustrates "first-order" noise-shaped pseudorandom chopping, but second-order or higher-order chopping can be readily provided by adding one or more additional loops such as the loop including delay elements 14 and 15 and summer 16. Second-order pseudorandom noise-shaped chopping would provide 2 delays than 1 in order to provide 2 "zeros" rather than one at DC and also providing 2 "zeros" instead of 1 at Fs/2.

What is claimed is:

1. A delta-sigma modulator comprising:
   (a) a chopper-stabilized integrator including a plurality of chopper stabilization input switches coupled to an input of the integrator and a plurality of chopper stabilization output switches coupled to an output of the integrator;
   (b) a quantizer having an input coupled to the output of the integrator;
   (c) an input signal acquiring circuit controlled by a switched reference feedback circuit and having an output coupled to the input of the integrator;
   (d) a frequency-shaped pseudo-random chopper clock signal generator circuit including a pseudo-random sequence generator and producing a frequency-shaped pseudo-random clock signal;

(e) resetting circuitry for resetting the pseudo-random sequence generator in synchronization with a digital output of the chopper-stabilized delta-sigma modulator to prevent wrap-around operation of the pseudorandom sequence generator; and (f) a logic circuit producing, in response to the frequency-shaped pseudo-random clock signal, chopper clock signals applied to control various ones of the chopper stabilization input switches and chopper stabilization output switches.

2. The delta-sigma modulator of claim 1 wherein the frequency-shaped pseudo-random sequence generator includes a digital delta-sigma modulator, the digital delta-sigma modulator including a feedback delay circuit, a first digital adder receiving as inputs a pseudo-random sequence signal produced by the pseudo-random sequence generator and an error feedback signal produced by the feedback delay circuit and functioning as a 1-bit quantizer producing the frequency-shaped pseudo-random clock signal in response to the pseudo-random sequence signal and the error feedback signal, a second digital adder producing a digital error signal as an input to the feedback delay circuit in response to the frequency-shaped pseudo-random clock signal and the error feedback signal.

3. The delta-sigma modulator of claim 2 including a decimation filter having an input coupled to an output of the quantizer, wherein the resetting circuitry includes a divider circuit which divides a clock signal operating at a sampling frequency of the delta-sigma modulator by a decimation ratio to produce a decimation clock signal, and wherein the pseudorandom sequence generator is clocked by the clock signal and includes a sequence of memory elements having reset inputs coupled to the decimation clock signal, and wherein the decimation filter is clocked by the clock signal and operates in response to the decimation clock signal to produce digital output words at the frequency of the decimation clock signal.

4. The delta-sigma modulator of claim 3 wherein the memory elements include D-type flip-flops, outputs of various D-type flip-flops being coupled to inputs of exclusive OR circuitry producing an output coupled to a D input of a first D-type flip-flop.

5. The delta-sigma modulator of claim 2 wherein the frequency-shaped pseudo-random clock signal constitutes a 1-bit quantization signal applied to a MSB of the second input of the second digital adder.

6. The delta-sigma modulator of claim 5 wherein the pseudo-random sequence signal is a 1-bit pseudo-random sequence signal.

7. The delta-sigma modulator of claim 2 wherein the feedback delay circuit delays the error signal twice by a predetermined amount to achieve increased attenuation near zero frequency and near a frequency.

8. The delta-sigma modulator of claim 2 wherein the digital delta-sigma modulator is a 1-bit digital delta-sigma modulator.

9. The delta-sigma modulator of claim 8 wherein the first and second digital adders are 2-bit adders, and the first digital adder has a first LSB input receiving the 1-bit output signal from the pseudo-random sequence generator.

10. The delta-sigma modulator of claim 9 wherein the second adder produces the error signal as a 2-bit signal and the feedback delay circuit produces the error feedback signal as a 2-bit signal.

11. The delta-sigma modulator of claim 10 wherein the feedback delay circuit includes at least one 2-bit delay circuit.

12. The delta-sigma modulator of claim 10 wherein the feedback delay circuit includes first and second sequentially coupled 2-bit delay circuits.

13. The delta-sigma modulator of claim 2 wherein the 1-bit quantizer includes an MSB bit of an output of the first adder.

14. The delta-sigma modulator of claim 3 wherein the decimation filter is a SYNC4 filter.

15. The delta-sigma modulator of claim 1 wherein the input signal acquiring circuit includes a switched capacitor input sampling circuit.

16. A method of reducing sensitivity of a chopper-stabilized modulator including an input signal acquiring circuit having an output coupled to an input of a chopper-stabilized integrator, and a quantizer having an input coupled to an output of the integrator, the method comprising:

(a) producing a frequency-shaped pseudo-random clock signal by means of a frequency-shaped pseudo-random chopper clock signal generator circuit including a pseudo-random sequence generator; and (b) automatically resetting the pseudo-random sequence generator in synchronization with a digital output of the chopper-stabilized delta-sigma modulator to prevent wrap-around operation of the pseudorandom sequence generator and thereby prevent noise due to such wrap-around operation.

17. The method of claim 16 including producing chopper clock signals in response to the frequency-shaped pseudo-random clock signal and applying the chopper signals to control various chopper stabilization input switches and chopper stabilization output switches of the chopper-stabilized delta-sigma modulator.

18. The method of claim 16 wherein step (a) includes i. applying a pseudo-random sequence signal to a first input of a first adder;

ii. applying an error feedback signal to a second input of the first adder and a first input of a second adder;

iii. producing a quantization signal in response to the first adder and applying the quantization signal to an MSB of a second input of the second adder;

iv. producing an error signal representing the difference between the quantization signal and the error feedback signal by means of the second adder;

v. delaying the error signal a predetermined amount to produce the error feedback signal, wherein energy of the quantization signal is spread over a broad frequency spectrum between DC and a chopping frequency; and vi. producing a pair of out-of-phase, non-overlapping chopping signals from the quantization signal and applying the chopping signals to corresponding chopper switches of the chopper stabilized amplifier.

19. The method of claim 18 including delaying the error signal twice by the predetermined amount to achieve increased attenuation near DC and near the frequency $F_S/2$, where $F_S$ is an input sampling frequency.

20. A delta-sigma modulator comprising:

(a) an input signal acquiring circuit having an output coupled to the input of a chopper-stabilized integrator, and a quantizer having an input coupled to an output of the integrator;

(b) means for producing a frequency-shaped pseudo-random clock signal; and
(c) means for resetting the pseudo-random sequence generator in synchronization with a digital output of the chopper-stabilized delta-sigma modulator to prevent wrap-around operation of the pseudorandom sequence generator and thereby prevent noise due to such wrap-around operation.

* * * * *